United States Patent [19]

Chamberlin

[11] 4,344,817
[45] Aug. 17, 1982

[54] PROCESS FOR FORMING TIN OXIDE CONDUCTIVE PATTERN

[75] Inventor: Rhodes R. Chamberlin, El Paso, TX

[73] Assignee: Photon Power, Inc., El Paso, Tex.

[21] Appl. No.: 186,855

[22] Filed: Sep. 15, 1980

[51] Int. Cl.³ .............................................. C03C 17/10
[52] U.S. Cl. ................... 156/645; 156/651; 156/659.1; 156/661.1; 156/901; 427/66; 427/110; 427/126.2; 427/126.3; 428/1
[58] Field of Search ............... 156/657, 650, 651, 652, 156/659.1, 901, 645, 661.1; 427/66, 108, 110, 126.2, 126.3, 157, 259; 428/1

[56] References Cited

U.S. PATENT DOCUMENTS

| | | | |
|---|---|---|---|
| 2,850,409 | 9/1958 | Boicey et al. | 117/211 |
| 2,919,366 | 12/1959 | Mash | 427/66 X |
| 3,003,904 | 10/1961 | Riggen | 156/650 X |
| 3,423,260 | 1/1969 | Heath et al. | 156/3 |
| 3,588,570 | 6/1971 | O'Keeffe | 313/94 |
| 3,647,566 | 3/1972 | Szupillo | 148/6.3 |
| 3,669,770 | 6/1972 | Fedlstein | 156/3 |
| 3,874,916 | 4/1975 | Livesay et al. | 117/211 |
| 3,880,633 | 4/1975 | Jordan et al. | 65/60 |
| 3,922,420 | 11/1975 | Schnable et al. | 428/210 |
| 3,928,658 | 12/1975 | Van Boxtel et al. | 427/108 |
| 3,959,565 | 5/1976 | Jordan et al. | 428/432 |
| 3,991,227 | 11/1976 | Carlson et al. | 427/39 |
| 4,009,061 | 2/1977 | Simon | 156/635 |
| 4,018,938 | 4/1977 | Feder et al. | 427/43 |
| 4,059,069 | 11/1977 | Ford | 118/642 |
| 4,095,006 | 6/1978 | Jordan et al. | 427/427 |
| 4,119,245 | 10/1978 | Smith | 427/66 |
| 4,158,072 | 6/1979 | Bohg et al. | 427/43 |
| 4,178,403 | 12/1979 | Sakurai et al. | 428/209 |
| 4,224,355 | 3/1978 | Lampkin et al. | 427/8 |
| 4,239,809 | 12/1980 | Lampkin et al. | 427/74 |

*Primary Examiner*—William A. Powell
*Assistant Examiner*—Thomas E. Bokan
*Attorney, Agent, or Firm*—Carwell & Helmreich

[57] ABSTRACT

A pattern of transparent conductive material, such as tin oxide, is formed on a transparent vitreous substrate using a polycrystalline material, such as cadmium or zinc sulfide, to mask the substrate surface while depositing material forming the transparent conductive layer. The polycrystalline material and any overlying transparent conductive material are easily removed by a chemical etch, leaving the desired pattern of transparent conductive material adhering to the substrate. Two electrically conductive patterns may be formed in intersecting relationship and isolated, one from the other. The degree of electrical connection between the two patterns will be a function of the resistance of the polycrystalline material therebetween at points of crossing. In some instances, electroluminescence may be obtained by selecting the proper crystalline material wherein an electrical display may be created by selectively energizing crossing electrical conductors.

18 Claims, 7 Drawing Figures

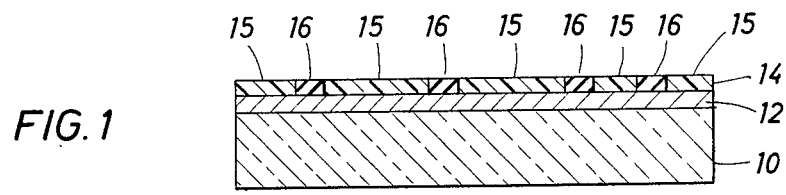
FIG. 1
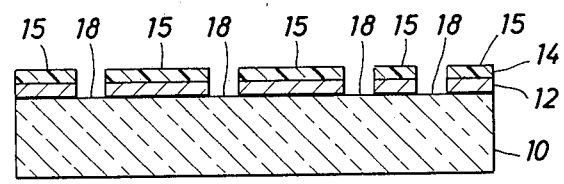
FIG. 2
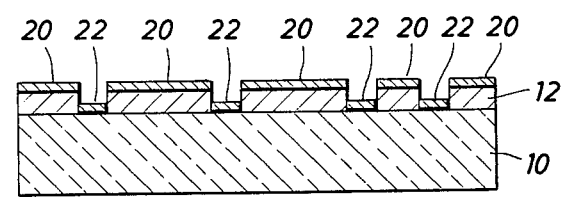
FIG. 3
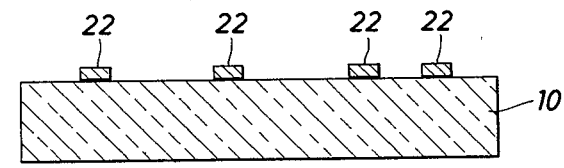
FIG. 4
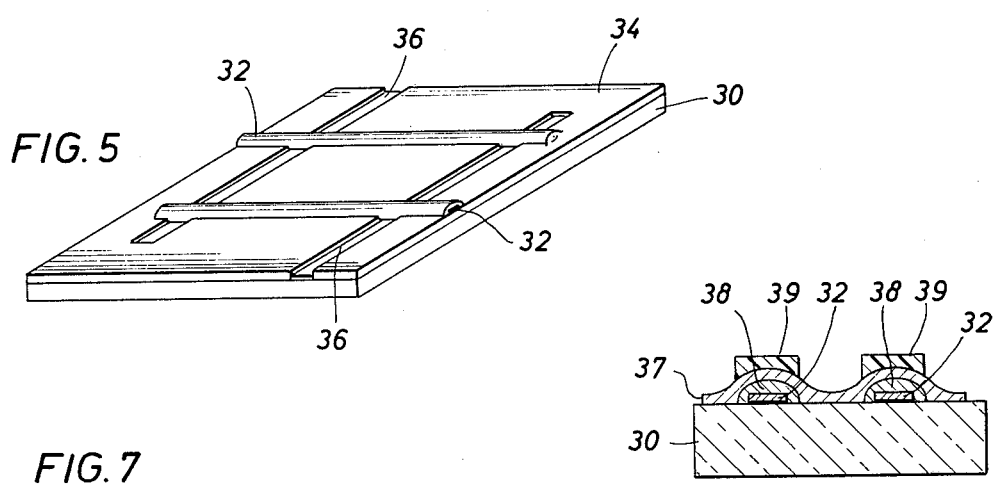
FIG. 5
FIG. 7
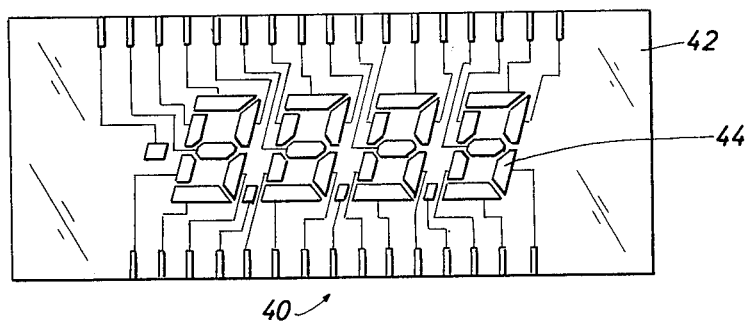
FIG. 6

PROCESS FOR FORMING TIN OXIDE CONDUCTIVE PATTERN

BACKGROUND OF THE INVENTION

This invention relates generally to a method of forming a high resolution pattern of transparent conductive tin oxide on a transparent vitreous substrate and, more particularly, to a process for forming such a pattern using a polycrystalline material on the substrate in mirror image to the pattern sought to be formed and using a high temperature spray process for forming the tin oxide.

The electrical display industry is developing a variety of displays which require a transparent vitreous material having a transparent electrically conductive coating formed thereon. The transparent electrically conductive coating is generally formed in a conductive pattern for conducting electrical current from edge portions of the substrate to central locations defining the display area. In one embodiment, the transparent pattern defines portions of the display for activating liquid crystals or gas discharge displays located therebehind and forming the desired visible pattern. Generally, a highly transparent and electrically conductive layer is required.

The prior art has developed many transparent electrically conductive materials which can be formed in suitable patterns. A particular material is a thin film of tin oxide formed with a dopant to increase the electrical conductivity of the thin tin oxide film. However, conventional dopants are frequently not stable at high temperatures. Accordingly, it would be desirable to use an undoped film of tin oxide where the resulting film must be subjected to high temperatures, either in further processing or in final application.

However, it is difficult to form films of tin oxide having the requisite high conductivities since film formation generally requires the use of high temperatures to improve the adherence of the tin oxide to the transparent vitreous substrate. In a conventional technique using conventional photolithographic masking layers to form a negative image of the desired pattern, the tin oxide is formed in the exposed portions of the substrate. Conventional photolithographic materials do not perform well when subjected to the high temperatures required for a suitable tin oxide film and can even interfere with forming transparent conductive films, either by introducing impurities during the heating process or by degrading during heating to a degree that high resolution films are not possible.

One prior art solution to this problem, as shown in U.S. Pat. No. 4,009,061, is to form the film of tin oxide over the entire substrate surface and thereafter chemically etch the film to form the desired pattern. The tin oxide is relatively inert and a hot solution of metal in acid is required to reduce the selected portion of the tin oxide for removal.

Another prior art solution is depicted in U.S. Pat. No. 3,928,658, where a metallic layer is used to form the negative portion of the desired pattern. The selected metal is generally more easily removed than the overlying tin oxide when subjected to relatively weak solvent solutions. However, removal of the tin oxide layer requires the solvent to penetrate the tin oxide layer to the underlying metallic layer and this can be difficult. A conventional process employs a vacuum deposition system for forming both the substrate masking layer and the electrode area. The resulting film of tin oxide overlying the masking layer is relatively continuous and thereby resistant to solvent penetration for masking layer removal.

An undoped tin oxide film having a low electrical resistivity has been developed by Photon Power, Inc., as described in U.S. Pat. Nos. 3,880,633 and 3,959,565, and pending patent application Ser. No. 886,890, now U.S. Pat. No. 4,224,355. However, the tin oxide film is formed by a spray technique which requires temperatures near the softening point of glass in order to obtain the desired optical and electrical characteristics. Thus, using the prior art masking techniques hereinabove discussed is extremely difficult with respect to forming a high resolution conductive pattern.

In many applications it may be desirable to form two or more intersecting electrically conductive patterns which are electrically insulated from one another. In the above referenced conventional techniques, the masking material may be a metal which does not serve to insulate between the intersecting conductive strips or may be a conventional photolithographic masking material which degrades at high temperatures. Furthermore, the tin oxide film can be poorly adherent to materials and form crossing junctions which are easily damaged.

Yet another problem occurs where chemical etching is used. Under-etching occurs where portions of the tin oxide film are in contact with the etchant for longer than other portions of the tin oxide film, leading to a loss in resolution available for the circuit. The minimum spacing is controlled by the ability to control the etchant rather than the ability to deposit the films.

The disadvantages of the prior art are overcome by the present invention, however, where an improved process is provided for forming the electrically conductive pattern using a polycrystalline material to form the mirror image.

SUMMARY OF THE INVENTION

In a preferred embodiment of the present invention, a pattern of transparent conductive material is formed on a transparent vitreous substrate using a polycrystalline material to mask the substrate surface while depositing material forming the transparent conductive layer. The polycrystalline material and any overlying transparent conductive material are easily removed by a chemical etch, leaving the desired pattern of transparent conductive material adhering to the substrate.

In a particularly desired form of the present invention, the transparent conductive layer is deposited using a spray process which forms a highly conductive and tightly adherent film on the substrate. The polycrystalline material is not affected by the high temperature required for the spray process. A preferred transparent conductive material is tin oxide, represented as $SnO_x$, where "X" is slightly less than the stoichiometric value of two (2).

In a preferred form of the present invention, the polycrystalline material may be cadmium sulfide (CdS) or zinc sulfide (ZnS), having crystal diameters of 0.02–0.2 microns. Where a spray process is used to form the polycrystalline material, the actual range of crystal sizes will be a function of the concentration of materials in the sprayed solution and of the temperature of the substrate during formation of the crystals.

In another embodiment of the present invention, two electrically conductive patterns may be formed in intersecting relationship and isolated, one from the other. In this embodiment, a second polycrystalline mask is formed to expose the second pattern on the areas of the substrate exclusive of the first pattern. It may be desirable to use a range of smaller crystal diameters than used in forming the first pattern. After the second transparent conductive layer is formed, photolithographic masking techniques are used to form masked areas over each point of the second pattern which crosses the first pattern. Subsequent removal of the polycrystalline mask will not affect those areas covered by the masking material, leaving the conductive elements separated by the polycrystalline material. The degree of electrical connection between the two patterns will then be a function of the resistance of the polycrystalline material. In some instances, electroluminescence may be obtained by selecting the proper crystalline material wherein an electrical display may be created by selectively energizing crossing electrical conductors.

One advantage of the present invention is the formation of undoped transparent conductive materials in a selected pattern.

Another advantage is the formation of high resolution patterns of transparent conductive films.

Yet another advantage is the formation of electrically conductive transparent films using spray processes for the masking materials and the transparent conductive material.

Another advantage of the present invention is the formation of a plurality of electrically conductive patterns in insulated intersecting relationship where the insulating material can have a variety of desired properties.

A feature of the present invention is the manufacture of a transparent electrically conductive circuit using a polycrystalline material having a selected range of crystal sizes to form a negative image of the desired pattern.

Another feature is forming a transparent electrically conductive circuit using a spray process to form a layer of transparent electrically conductive material.

One other advantage is to provide a process for forming a transparent electrically conductive circuit by removing polycrystalline masking material and the transparent conductive material thereon, leaving the transparent electrically conductive material in the desired circuit pattern.

These and other features and advantages of the present invention will become apparent from the following detailed description, wherein reference is made to the figures in the accompanying drawings.

IN THE DRAWINGS

FIG. 1 is a cross-sectional view of an intermediate product.

FIG. 2 is a cross-sectional view of the circuit negative pattern.

FIG. 3 is a cross-sectional view of an intermediate product.

FIG. 4 is a cross-sectional view of a completed conductive circuit.

FIG. 5 is an isometric view of an intermediate product where crossing conductors are provided.

FIG. 6 is a cross-sectional view of a completed crossing conductor circuit.

FIG. 7 is a plan view of a typical configuration of a transparent electrically conductive circuit.

DETAILED DESCRIPTION

Referring now to FIG. 1, there is depicted a cross-sectional view of transparent vitreous substrate 10 during the process of forming a polycrystalline mask on the substrate 10. Polycrystalline layer 12 has been formed over the entirety of substrate 10 and a layer of photolithographic masking material 14 has been coated on to polycrystalline layer 12. As depicted in FIG. 1, the photolithographic material has been treated to form areas 15, which are resistant to chemical etching, and areas 16, which are readily removed in a chemical etch.

A primary end product of the present invention is an electrical display wherein the electrically conductive pattern is used to generate an electrical field which, in turn, affects adjacent material to obtain a visually distinguishable pattern. Thus, substrate 10 is generally a suitable transparent material, such as glass or quartz. As hereinafter explained, substrate 10 is preferably a vitreous material which can be subjected to high temperatures.

A polycrystalline material is preferably selected to form layer 12, which will form the masking pattern on substrate 10. As hereinabove discussed, difficulties exist in the prior art with respect to providing a suitable masking material which does not degrade or contaminate the transparent conductive material when subjected to very high temperatures. Some masking materials which can withstand high temperatures, such as metals, may be difficult to remove where a continuous film of the transparent conductive material is also formed over the masking material. Further, metallic materials are generally electrically conductive and cannot be used to insulate between crossing patterns of conductors.

Thus, a polycrystalline material 12 has been selected in order to obtain easy and accurate removal of portions of the subsequently applied transparent conductive layer outside the desired pattern. The ease of removal is functionally related to the crystallinity, or crystal sizes, of the polycrystalline material. The polycrystalline surface will be uneven due to the multicrystalline nature of layer 12, and a discontinuous layer of transparent conductive material will be formed, permitting an etching material to quickly penetrate and remove the polycrystalline material. The prompt removal of the masking material with relatively weak reagents permits high resolution films to be formed, as hereinafter explained.

A particularly suitable polycrystalline material is comprised of cadmium sulfide. In a preferred embodiment, the cadmium sulfide film is formed by spraying solutions onto a heated substrate surface where the solutions react to form the cadmium sulfide layer. The polycrystalline film is formed to a thickness which is sufficient to form a uniform layer over the substrate surface which is substantially free of defects which might expose portions of the surface. Film thicknesses of 0.5–1.5 microns are generally sufficient using the processes hereinafter described.

In particular, U.S. patent applications Ser. No. 886,890 and, No. 886,891, now U.S. Pat. Nos. 4,224,355 and 4,239,809 respectively, both assigned to Photon Power, Inc., which disclosures are incorporated herein by reference, describe processes for forming high quality films of cadmium sulfide and tin oxide for use in photovoltaic cells. The cadmium sulfide and tin oxide films produced by the process described therein are suitable for use in forming the polycrystalline mask and the transparent conductive layer, respectively.

Referring first to the polycrystalline layer of CdS, a suitable spray solution forming CdS crystals in the range of 0.1 to 0.2 microns is prepared in the following proportions:
- 800 cc—Water
- 13.7 gms—$CdCl_2.2.5\ H_2O$
- 6.13 gms—Thiourea A second CdS spray solution forming crystals having diameters in the range of 0.02 to 0.05 microns is prepared in the following proportions:
- 5 l.—Water
- 150 cc—Thiourea (1 Molar solution)
- 150 cc—$CdCl_2$ (1 Molar solution)

The selected solution is sprayed while the substrate is heated to a temperature in the range of 250°–400° C. to obtain the desired crystal sizes. The substrate temperature which is selected for a particular concentration of sprayed materials may be varied to more particularly define the crystal sizes within the range generally produced by that concentration of materials. Higher temperatures result in smaller crystal diameters being produced from the sprayed materials or, in other words, the crystallinity is decreased by increasing the temperature. It should be noted that the patents and patent applications referenced herein, and directed to forming photovoltaic cells generally subject the CdS layer to a heat treatment subsequent to the spray process for forming larger diameter crystals. This heat treatment step is not performed when forming a polycrystalline mask herein.

The CdS film formed with the above mentioned crystal sizes has a glass-like appearance, although the polycrystalline nature of the film is clearly shown under a scanning electron microscope. A film thickness of about 1.5 microns is generally sufficient to insure against pinhole defects in the layer of CdS.

In addition to $CdCl_2$, there are many suitable spray solutions capable of forming the polycrystalline masking materials. More particularly, a ZnS film may be formed by substituting $ZnCl_2$ in place of the $CdCl_2$ in the above spray formulations. U.S. Pat. No. 4,095,006, issued June 13, 1978, which enclosure is incorporated herein by reference, discloses a number of cadmium salts and solutions which may be used to form suitable cadmium sulfide films. Further, cadmium thiocyanate may also be sprayed, eliminating the need for a separate sulphur-containing compound.

Thus, a variety of polycrystalline films may be formed which function satisfactorily. The basic functional requirements, when met, act to assist in obtaining a high resolution for the subsequent electrically conductive circuit. A thin film is desired to minimize the time required for film removal, thus minimizing any undercutting of the transparent conductive film forming the circuit pattern. The acceptable range of crystal sizes includes crystals large enough to obtain the discontinuous surface which assists in film removal, but small enough to maintain the desired resolution. Larger crystals can reduce the resolution along pattern edges and can provide for capillary action between crystals which increase the incidence of shorting defects.

As hereinbelow shown, the precision with which the overlying 30 photolithographic mask can be formed is reduced and the resulting resolution of the negative image which defines the desired transparent electrically conductive pattern. However, as hereinabove explained, the spray solution concentration and the substrate temperature can be coordinated to obtain an optimum process for the particular circuit configuration being formed.

Once the polycrystalline layer is completed, the negative image of the desired pattern is formed in the mask. Referring again to FIG. 1, a conventional photolithographic mask is formed over the polycrystalline layer using conventional photosensitive materials which are resistant to chemical action when developed. Many suitable proprietary materials are available from manufacturers such as Kodak and Shipley. It is desirable that the material use a water based developer to minimize subsequent chemical contamination. It is also desirable that the chemically resistant material remaining after developing and etching be volatile at the temperatures used to form the transparent conductive layer. As is well known in the art related to photolithographic masking, either a positive or a negative resist may be used in order to define the desired pattern for exposing the polycrystalline layer.

As further shown in FIG. 1, photoresist layer 14 has been applied by any standard technique such as roller application, spray application, or a dip process. The applied photoresist material is exposed, as hereinabove explained, to define areas 15 of the photoresist which are resistant to chemical activities and areas 16 of resist layer 14 which are easily removable. Thus, after being developed, photoresist layer 14 has areas 15 which define the negative image of the pattern for the electrically conductive material.

Referring now to FIG. 2, there is depicted the layered configuration after etching the polycrystalline layer 12 has been completed. The chemically resistant areas 15 of photoresist layer 14 protect the underlying cadmium sulfide layer 12 wherein the unprotected areas are removed leaving exposed areas 18 of substrate 10. Where the polycrystalline layer 12 is formed of CdS, a suitable etching material is formed from a ten-percent aqueous solution of HCl (0.3 N solution). Using the above process, substrate 10 now has exposed areas 18 in the configuration of the desired electrically conductive pattern.

The next process step, depicted in FIG. 3, is the formation of an electrically conductive material over the entire area of substrate 10. A transparent electrically conductive film having highly desirable properties relating to optical transparency, adherence, and electrical conductivity may be formed using a spray pyrolysis process as defined in U.S. Pat. Ser. No. 886,890, filed Mar. 15, 1978, now U.S. Pat. No. 4,224,355 which disclosure is incorporated herein by reference. As taught in the subject patent, a solution containing a tin salt in an organic solvent is prepared, including a fluorine-containing compound, typically in the following proportion:
- 300 ml—$CH_3OH$ (Methanol)
- 2.5 ml—HCl (concentrated)
- 1.7 gms—$NH_4HF_2$
- 49.6 gms—$SnCl_2.2H_2O$ The solution is preferably sprayed over the substrate while the substrate is heated to maintain the temperature in the range of 440°–480° C. throughout the spray process. The resulting electrically conductive film forms a very tightly adherent and chemically resistant layer 22 on substrate 10.

The film portion 20 which forms over the remaining polycrystalline layer 12 is affected by the crystallinity of layer 12 as herein described. Although portion 20 of electrically conductive layer is depicted as a smooth continuous layer, the crystals forming polycrystalline layer 12 generally act to disrupt portion 20 to a degree sufficient for a subsequent etching chemical to penetrate and remove layer 12. The larger the crystal size, the faster the layers 12 and 20 are removed. Large crystals, however, also act to increase the incidence of pin-hole defects and reduces pattern edge resolution. Small diameter crystals reduce the above effects and a mild abrading of the surface will generally increase the removal rate to acceptable levels. The high substrate temperature required to form the desired electrically conductive film also acts to volatilize the areas 15 of the photoresist layer 14 (see FIG. 2) which remain after the chemical etch. The cadmium sulfide crystalline layer 12 is relatively unaffected by these high temperatures, except that some crystal growth may occur as a result of the high temperatures, which generally increases the ease of removing this layer.

FIG. 4 illustrates a cross-sectional view of the completed circuit pattern, having electrically conductive areas 22 formed on substrate 10 to define the desired pattern. The finished product is formed by etching the layered configuration depicted in FIG. 3 typically in an aqueous solution of HCl (0.5–0.8 N) for the time needed to remove polycrystalline layer 12 and, therewith, the conductive areas 20 formed over the polycrystalline material 12. Thus, the etching material does not have to act directly on the electrically conductive material, permitting relatively weak etching chemicals to be used. The selected HCl etchant produces substantially no undercutting of the remaining electrically conductive film 22 and an extremely high pattern resolution may be obtained since no allowance is required for etchant undercutting.

In another embodiment of the present invention, a three dimensional conductor configuration may be obtained. As shown in FIG. 5, a first electrically conductive pattern containing conductors 32 has been formed on substrate 30 using the process hereinabove described for FIGS. 1-4. A second polycrystalline layer 34 has been formed over the entire area of substrate 30, including the first conductive pattern 32. As hereinabove described, portions of polycrystalline layer 34 have been removed to expose a second conductive pattern 36. Conductive pattern 36 is configured to maintain second polycrystalline layer 34 where second conductive pattern 36 crosses first conductive pattern 32. For ease of illustration, a protective photoresist layer is not depicted in FIG. 5, although such a layer could be present, but which volatilizes during the formation of the electrically conductive layer on exposed areas 36.

Referring now to FIG. 6, there is depicted a cross-sectional illustration of the two electrically conductive patterns at selected crossing points. The first conductive pattern 32 is formed on substrate 30. Second conductive pattern 37 is formed on substrate 30 and over portions of the second polycrystalline layer 38 at the junction points. Thus, the second conductive pattern 37 is separated from the first conductive pattern 32 by polycrystalline material 38. As hereinabove explained, other portions of the electrically conductive material form on the other exposed portions of the second polycrystalline layer 34.

To complete the three dimensional conductor configuration, a chemically resistant material 39, such as a conventional photoresist material, is formed over the junction regions of electrically conductive patterns 32 and 37 to protect the underlying polycrystalline layer 38 during the final chemical etch. Accordingly, the final chemical etch removes those portions of the second polycrystalline layer 34 not protected by the chemically resistant areas 39 thereby affecting removal of any overlying electrically conductive material. The remaining materials form the three dimensional electrically conductive pattern.

As hereinabove explained, the three dimensional configuration can be formed to a high degree of resolution wherein the junction points form a matrix of dots convenient for generating data displays. In this embodiment, a suitable polycrystalline material may be formed by using ZnS as the polycrystalline material with copper added to dope the ZnS to form a phosphor. Activating a suitable pair of crossing conductors would activate the phosphor wherein the dot would luminesce. Since the above spray process is suitable for filming large areas of substrate, a large area graphical display could be created using the process hereinabove described.

Referring now to FIG. 7, there is depicted a typical pattern of electrical conductors useful for activating a numerical display using liquid crystals. The completed circuit pattern 40 is formed from transparent substrate 42 having transparent electrically conductive pattern 44 formed thereon. The ability to form circuit patterns with a high resolution permits a closely packed display to be used, thus minimizing the space required to mount the display. Further, the transparent conductive film 44 formed as hereinabove described, at high temperatures, is highly transparent and does not detract from the activated display beneath the circuit pattern. The high electrical conductivity of the film which forms conductive pattern 44 results in minimizing electrical usage and heating of the display. Many other electrical circuits and displays are possible using the process hereinabove described, FIG. 7 being merely illustrative of a typical use for the transparent electrically conductive pattern.

It is therefore apparent that the present invention is one well adapted to attain all of the objects and advantages hereinabove set forth, together with other advantages which will become obvious and inherent from a description of the process itself. It will be understood that certain combinations and subcombinations are of utility and may be employed without reference to other features and subcombinations. This is contemplated by and is within the scope of the present invention.

What is claimed is:

1. A method of manufacture for transparent electrically conductive circuits, comprising the steps of:
    forming on a transparent vitreous substrate a layer of polycrystalline material having a first selected range of crystal diameters,
    selectively removing portions of said polycrystalline material to define a first desired pattern,
    forming a layer of transparent electrically conductive material over an area containing at least said desired pattern, and
    removing remaining portions of said polycrystalline material and overlying portions of said transparent conductive material therewith, wherein remaining portions of said transparent electrically conductive material define a first circuit.

2. The method of claim 1, wherein forming said layer of polycrystalline material includes the steps of:
heating said substrate to a first selected temperature,
spraying a solution containing a first concentration of polycrystalline film-forming materials onto said heated substrate,
said first substrate temperature and said first concentration of materials cooperating to form said first selected range of crystal diameters.

3. The method of claims 1 or 2, wherein said layer of polycrystalline material is a compound of cadmium or zinc.

4. The method of claims 1 or 2, wherein selectively removing said polycrystalline material includes the steps of:
forming a photomask exposing said polycrystalline material corresponding to said desired pattern,
chemically removing said exposed polycrystalline material, and
heating said substrate to volatilize remaining portions of said photomask before forming said layer of transparent conductive material.

5. The method of claim 4, wherein said layer of polycrystalline material is a compound of cadmium or zinc.

6. The method of claims 1 or 2, wherein forming said layer of transparent electrically conductive material comprises the steps of:
heating said substrate to a second selected temperature, and
spraying a solution containing tin salts while heating said substrate.

7. The method of claim 6, wherein selectively removing said polycrystalline material includes the steps of:
forming a photomask exposing said polycrystalline material corresponding to said desired pattern,
chemically removing said exposed polycrystalline material, and
heating said substrate to volatilize remaining portions of said photomask before forming said layer of transparent conductive material.

8. The method of claim 7, wherein said layer of polycrystalline material is a compound of cadmium or zinc.

9. The method of claim 1, wherein removing said remaining portions of said polycrystalline material includes etching with HCl.

10. The method of claim 9, further including the step of abrading said transparent conductive layer overlying said polycrystalline material prior to etching.

11. The method of claims 9 or 10, wherein forming said layer of polycrystalline material includes the steps of:
heating said substrate to a first selected temperature,
spraying a solution containing a first concentration of polycrystalline film-forming materials onto said heated substrate,
said first substrate temperature and said first concentration of materials cooperating to form said first selected range of crystal diameters.

12. The method of claim 11, wherein selectively removing said polycrystalline material includes the steps of:
forming a photomask exposing said polycrystalline material corresponding to said desired pattern,
chemically removing said exposed polycrystalline material, and
heating said substrate to volatilize remaining portions of said photomask before forming said layer of transparent conductive material.

13. The method of claim 12, wherein forming said layer of transparent electrically conductive material comprises the steps of:
heating said substrate to a second selected temperature, and
spraying a solution containing tin salts while heating said substrate.

14. The method of claim 13, wherein said layer of polycrystalline material is a compound of cadmium or zinc.

15. The method of claim 1, further including forming a second pattern of transparent electrically conductive material in crossing insulated relationship with said first circuit.

16. The method of claim 15, wherein forming said second circuit further comprises the steps of:
forming a layer of polycrystalline material having a second selected range of crystal diameters over an area including said first and second patterns;
selectively removing portions of said polycrystalline material to define portions of said second pattern exclusive of said first circuit pattern;
spray forming a layer of transparent electrically conductive material over an area containing at least said second pattern;
forming discrete areas of a resist material over said transparent electrically conductive material where said crossing insulated relationship between said first and second circuit patterns is desired; and
removing remaining portions of said polycrystalline material with exposed overlying portions of said transparent conductive material.

17. The method of claim 16, wherein said polycrystalline material having a second selected range of crystal diameters contains an electroluminescent phosphor.

18. The method of claim 17, wherein said phosphor is zinc sulfide doped with copper.

* * * * *